US012764974B2

(12) United States Patent
Yu et al.

(10) Patent No.: US 12,764,974 B2
(45) Date of Patent: Oct. 13, 2026

(54) SEMICONDUCTOR PACKAGE HAVING A THICK LOGIC DIE

(71) Applicant: MEDIATEK INC., Hsin-Chu (TW)

(72) Inventors: Ta-Jen Yu, Hsinchu City (TW); Wen-Chin Tsai, Hsinchu City (TW); Isabella Song, Hsinchu City (TW); Che-Hung Kuo, Hsinchu City (TW); Hsing-Chih Liu, Hsinchu City (TW); Tai-Yu Chen, Hsinchu City (TW); Shih-Chin Lin, Hsinchu City (TW); Wen-Sung Hsu, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 323 days.

(21) Appl. No.: 18/203,666

(22) Filed: May 31, 2023

(65) Prior Publication Data

US 2023/0422525 A1 Dec. 28, 2023

Related U.S. Application Data

(60) Provisional application No. 63/354,361, filed on Jun. 22, 2022, provisional application No. 63/354,363, filed on Jun. 22, 2022.

(51) Int. Cl.
*H10B 80/00* (2026.01)
*H10B 12/00* (2023.01)
(Continued)

(52) U.S. Cl.
CPC ............ *H10B 80/00* (2023.02); *H10B 12/00* (2023.02); *H10W 42/121* (2026.01);
(Continued)

(58) Field of Classification Search
CPC ..... H10B 80/00; H10B 12/00; H10W 42/121; H10W 70/611; H10W 70/685;
(Continued)

(56) References Cited

U.S. PATENT DOCUMENTS

2004/0089943 A1 5/2004 Kirigaya
2005/0104217 A1 5/2005 Narayan
(Continued)

FOREIGN PATENT DOCUMENTS

CN 113410206 A 9/2021
KR 10-1681028 B1 12/2016
(Continued)

OTHER PUBLICATIONS

Yu, the specification, including the claims, and drawings in the U.S. Appl. No. 18/106,499, filed Feb. 7, 2023.
(Continued)

*Primary Examiner* — Thanh Y. Tran
(74) *Attorney, Agent, or Firm* — Winston Hsu

(57) ABSTRACT

A semiconductor package includes a bottom substrate and a top substrate space apart from the bottom substrate such that the bottom substrate and the top substrate define a gap therebetween. A logic die and a memory die are mounted on a top surface of the bottom substrate in a side-by-side fashion. The logic die may have a thickness not less than 125 micrometers. A connection structure is disposed between the bottom substrate and the top substrate around the logic die and the memory die to electrically connect the bottom substrate with the top substrate. A sealing resin fills in the gap between the bottom substrate and the top substrate and sealing the logic die, the memory die, and the connection structure in the gap.

8 Claims, 6 Drawing Sheets

(51) Int. Cl.
*H10W 42/00* (2026.01)
*H10W 70/60* (2026.01)
*H10W 70/685* (2026.01)
*H10W 74/10* (2026.01)
*H10W 90/00* (2026.01)

(52) U.S. Cl.
CPC ........ *H10W 70/611* (2026.01); *H10W 70/685* (2026.01); *H10W 74/117* (2026.01); *H10W 90/00* (2026.01); *H10W 90/724* (2026.01)

(58) Field of Classification Search
CPC . H10W 74/117; H10W 90/00; H10W 90/724; H10W 70/60; H10W 72/072; H10W 72/073; H10W 74/142; H10W 74/15; H10W 90/754; H10W 70/614; H10W 90/401; H10W 90/701; H10W 90/722; H10W 90/734
See application file for complete search history.

(56) References Cited

U.S. PATENT DOCUMENTS

| | | | | |
|---|---|---|---|---|
| 2014/0151867 | A1 | 6/2014 | Lin | |
| 2016/0172292 | A1 | 6/2016 | Hsu | |
| 2016/0190054 | A1 | 6/2016 | Park | |
| 2016/0329298 | A1* | 11/2016 | Lee | H10W 70/65 |
| 2016/0329299 | A1 | 11/2016 | Lin | |
| 2017/0221866 | A1 | 8/2017 | Cho | |
| 2018/0040578 | A1 | 2/2018 | Yu | |
| 2019/0259726 | A1 | 8/2019 | Jeng | |
| 2020/0051918 | A1 | 2/2020 | Bae | |
| 2020/0203279 | A1 | 6/2020 | Ha | |
| 2021/0028145 | A1 | 1/2021 | Yu | |
| 2021/0066093 | A1 | 3/2021 | Kim | |
| 2021/0134757 | A1 | 5/2021 | Gandhi | |
| 2021/0225805 | A1 | 7/2021 | Watanabe | |
| 2021/0257305 | A1 | 8/2021 | Yim | |
| 2021/0272929 | A1 | 9/2021 | Tsai | |
| 2021/0296249 | A1 | 9/2021 | Khim | |
| 2021/0343651 | A1 | 11/2021 | Tsai | |
| 2021/0407911 | A1 | 12/2021 | Park | |
| 2022/0013474 | A1 | 1/2022 | Yoo | |
| 2022/0173082 | A1 | 6/2022 | Kim | |
| 2022/0285328 | A1* | 9/2022 | Kim | H10P 72/74 |
| 2023/0023672 | A1* | 1/2023 | Kwon | H10W 42/121 |
| 2023/0178502 | A1* | 6/2023 | Goh | H10W 90/00 257/777 |

FOREIGN PATENT DOCUMENTS

| | | | |
|---|---|---|---|
| KR | 10-2017-0063231 | A | 6/2017 |
| KR | 10-2021-0021257 | A | 2/2021 |
| TW | 200715425 | | 4/2007 |
| TW | 201044546 | A1 | 12/2010 |
| TW | 201709450 | A | 3/2017 |
| TW | 201832410 | A | 9/2018 |
| TW | 202109801 | A | 3/2021 |
| TW | 202212427 | A | 4/2022 |
| TW | 202220123 | A | 5/2022 |

OTHER PUBLICATIONS

Yu, the specification, including the claims, and drawings in the U.S. Appl. No. 18/107,520, filed Feb. 9, 2023.

Yu, the specification, including the claims, and drawings in the U.S. Appl. No. 18/203,631, filed May 30, 2023.

* cited by examiner

SEMICONDUCTOR PACKAGE HAVING A THICK LOGIC DIE

CROSS REFERENCE TO RELATED APPLICATIONS

This application claims the benefit of U.S. Provisional Application No. 63/354,361, filed on Jun. 22, 2022. Further, this application claims the benefit of U.S. Provisional Application No. 63/354,363, filed on Jun. 22, 2022. The contents of these applications are incorporated herein by reference.

BACKGROUND

The present disclosure relates generally to the field of semiconductor packaging. More particularly, the present disclosure relates to a thermally enhanced semiconductor package having a thick logic die.

Package-on-Package (PoP) is an integrated circuit packaging method to combine vertically discrete logic and memory ball grid array (BGA) packages. Two or more packages are installed atop each other, i.e. stacked, with a standard interface to route signals between them. This allows higher component density in devices, such as mobile phones or digital cameras.

PoP solutions are commonly used in baseband and applications processors in mobile phones. High-end phones have seen the fastest adoption of PoP packaging to provide high I/O and performance requirements. The main advantage of stacked PoP is that devices can be separately fully tested before assembly.

With development of the semiconductor industry, many studies are being conducted to improve reliability and durability of the semiconductor packages. An improvement of the PoP structure to increase the efficiency of thermal dissipation becomes very important and imperative.

SUMMARY

It is one object of the present disclosure to provide an improved semiconductor package in order to solve the above-mentioned prior art deficiencies or shortcomings.

One aspect of the present disclosure provides a semiconductor package including a bottom substrate and a top substrate space apart from the bottom substrate such that the bottom substrate and the top substrate define a gap therebetween. A logic die and a memory die are mounted on a top surface of the bottom substrate in a side-by-side fashion. The logic die may have a thickness not less than 125 micrometers. A connection structure is disposed between the bottom substrate and the top substrate around the logic die and the memory die to electrically connect the bottom substrate with the top substrate. A sealing resin fills in the gap between the bottom substrate and the top substrate and sealing the logic die, the memory die, and the connection structure in the gap.

According to some embodiments, the logic die has a thickness of 125-750 micrometers.

According to some embodiments, the logic die is mounted on the top surface of the bottom substrate in a flip-chip fashion.

According to some embodiments, the logic die comprises an active front side and a passive rear side, and wherein, a plurality of input/output (I/O) pads is provided on the active front side and the logic die is electrically connected to the bottom substrate through a plurality of conductive elements formed on the plurality of I/O pads, respectively.

According to some embodiments, the memory die comprises a dynamic random access memory (DRAM) die.

According to some embodiments, the DRAM die comprise a Double Data Rate DRAM die.

According to some embodiments, the DRAM die comprise a Low Power Double Data Rate DRAM die.

According to some embodiments, the logic die comprises a near-side DDR connection circuit region that is adjacent to the DRAM die and a far-side DDR connection circuit region that is disposed farther away from the DRAM die, and wherein signals are transmitted between the DRAM die and the near-side DRAM connection circuit region through the conductive interconnect structures of the bottom substrate, and signals are transmitted between the DRAM die and the far-side DRAM connection circuit region through the top substrate and the connection structure.

According to some embodiments, the connection structure comprises a plurality of conductive structures and an insulating layer surrounding the plurality of conductive structures.

According to some embodiments, the logic die comprises a system-on-chip die, an application processor die, or a baseband processor die.

Another aspect of the present disclosure provides a semiconductor package including a substrate and a fan-out device mounted on a top surface of the substrate. The fan-out device comprises a logic die and a re-distribution layer disposed between the logic die and the substrate. The logic die may have a thickness not less than 125 micrometers. A memory die is mounted on the top surface of the substrate. The fan-out device and the memory die are arranged in a side-by-side fashion. A sealing resin seals the logic die and the memory die.

According to some embodiments, the logic die has a thickness of 125-750 micrometers.

According to some embodiments, the memory die comprises a dynamic random access memory (DRAM) die.

According to some embodiments, the DRAM die comprise a Double Data Rate DRAM die.

According to some embodiments, the DRAM die comprise a Low Power Double Data Rate DRAM die.

According to some embodiments, the logic die comprises a near-side DDR connection circuit region that is adjacent to the DRAM die and a far-side DDR connection circuit region that is disposed farther away from the DRAM die, and wherein signals are transmitted between the DRAM die and the near-side DRAM connection circuit region through the re-distribution layer and the substrate, and signals are transmitted between the DRAM die and the far-side DRAM connection circuit region through the re-distribution layer and the substrate.

According to some embodiments, the semiconductor package further comprises a stiffener frame mounted on the substrate.

According to some embodiments, the stiffener frame comprises at least one first stiffener bars disposed in proximity to the logic die and the memory die, wherein the at least one first stiffener bars extend along a first direction.

According to some embodiments, the stiffener frame further comprises at least one second stiffener bars disposed in proximity to the logic die and the memory die, wherein the at least one second stiffener bars extend along a second direction.

According to some embodiments, the first direction is orthogonal to the second direction.

These and other objectives of the present disclosure will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the present disclosure and are incorporated in and constitute a part of this specification. The drawings illustrate embodiments of the present disclosure and, together with the description, serve to explain the principles of the present disclosure. In the drawings.

DETAILED DESCRIPTION

In the following detailed description of embodiments of the present disclosure, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present disclosure is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Figure 1:
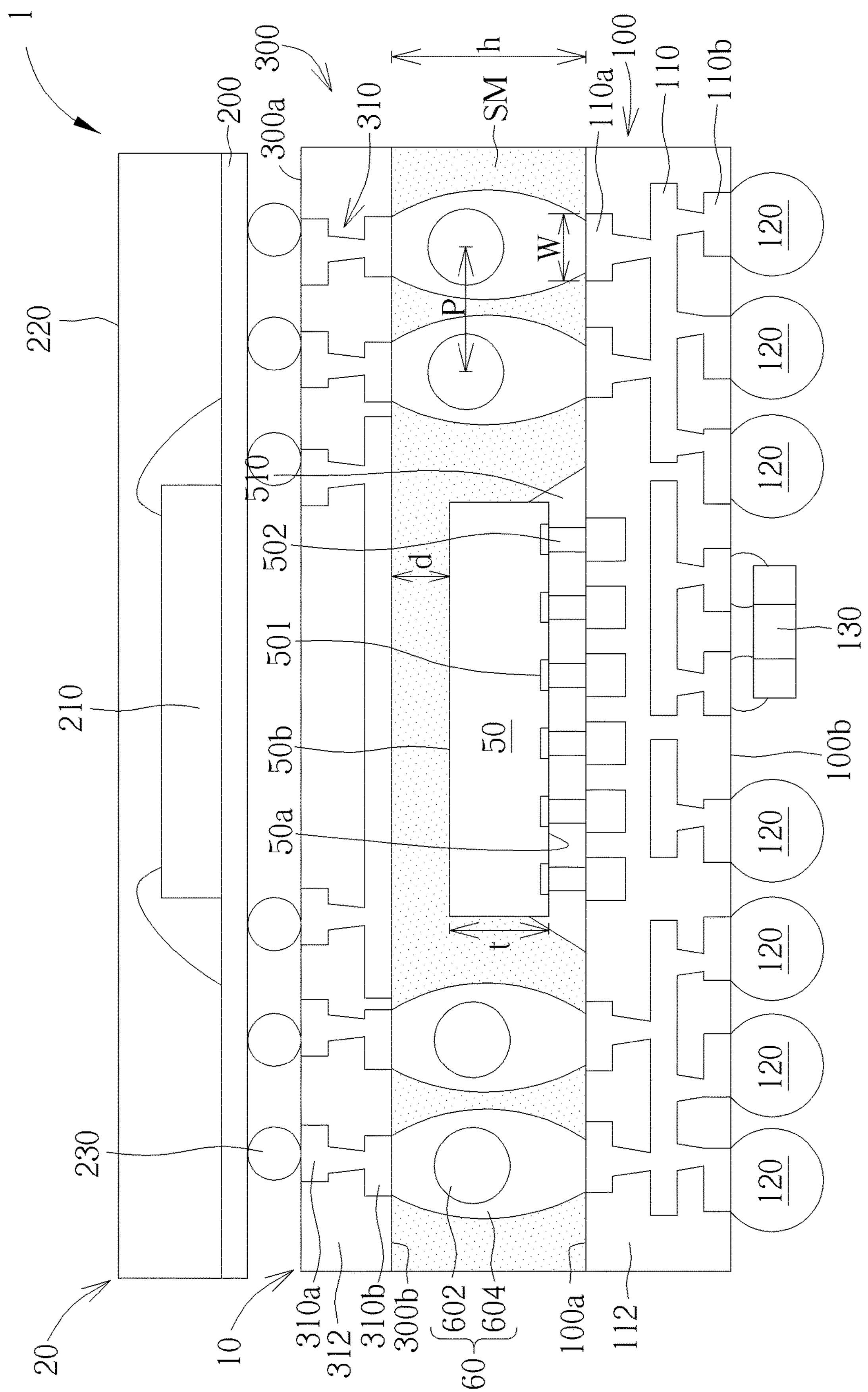
FIG. 1 is a schematic, cross-sectional diagram showing an exemplary package on package (PoP) having thick logic die.

FIG. 1 is a schematic, cross-sectional diagram showing an exemplary package on package (PoP) having thick logic die. As shown in FIG. 1, the PoP device 1 such as a high-bandwidth PoP (HBPoP) may comprise a semiconductor package 10 and a memory package 20 such as a LPDDR DRAM package stacked on the semiconductor package 10. According to an embodiment, for example, the memory package 20 may comprise a substrate 200, a memory die 210 mounted on the substrate 200, and a molding compound 220 encapsulating the memory die 210. According to an embodiment, for example, the memory package 20 may be electrically connected to the semiconductor package 10 through a plurality of conductive elements 230 such as solder balls or bumps.

The semiconductor package 10 comprises a bottom substrate 100 having a top surface 100*a* and an opposing bottom surface 100*b*. According to an embodiment, the bottom substrate 100 may be a printed wiring board, a re-distribution layer (RDL) substrate, or a package substrate having a plurality of conductive interconnect structures 110 and at least an insulating layer 112. According to an embodiment, for example, the conductive interconnect structures 110 may comprise a plurality of pad patterns 110*a* distributed on the top surface 100*a* and a plurality of pad patterns 110*b* distributed on the bottom surface 100*b*.

According to an embodiment, a logic die 50 is mounted on the top surface 100*a* of the bottom substrate 100 in a flip-chip fashion. According to an embodiment, for example, the logic die 50 may be an application processor (AP) die or a baseband processor die, but is not limited thereto. According to an embodiment, for example, the logic die 50 has a thickness t not less than 125 micrometers. For example, the thickness t ranges between 125-350 micrometers, for example, 170 micrometers, which is thicker than a normal logic die (has a thickness of about 80 micrometer) used in high-end mobile devices such as high-end mobile phones. The increased die thickness can improve the thermal performance of the semiconductor package as well as the performance of the XPU.

According to an embodiment, for example, the logic die 50 has an active front side 50*a* and a passive rear side 50*b*. According to an embodiment, for example, a plurality of input/output (I/O) pads 501 is provided on the active front side 50*a*. According to an embodiment, for example, the logic die 50 is electrically connected to the bottom substrate 100 through a plurality of conductive elements 502 such as solder bumps, metal bumps or pillars, which are formed on the plurality of I/O pads 501, respectively. According to an embodiment, underfill resin 510 may be filled into a space between the logic die 50 and the top surface 100*a* of the bottom substrate 100. According to an embodiment, the conductive elements 502 are surrounded by the underfill resin 510.

According to an embodiment, the logic die 50 is disposed between the bottom substrate 100 and a top substrate 300. According to an embodiment, the top substrate 300 may be a printed wiring board or a package substrate having a plurality of conductive interconnect structures 310 and at least an insulating layer 312. According to an embodiment, for example, the conductive interconnect structures 310 may comprise a plurality of pad patterns 310*a* distributed on a top surface 300*a* of the top substrate 300 and a plurality of pad patterns 310*b* distributed on a bottom surface 300*b* of the top substrate 300. According to an embodiment, a plurality of copper cored solder balls 60 or other more ductility metal connection is disposed on the pad patterns 310*b* distributed on the bottom surface 300*b* of the top substrate 300, respectively.

According to an embodiment, the bottom substrate 100 is electrically connected with the top substrate 300 via the copper cored solder balls 60 around the logic die 50. The sealing resin SM is filled into a gap having a gap height h between the bottom substrate 100 and the top substrate 300. According to an embodiment, for example, the gap height h may range between 160-450 micrometers in 0.2-0.3 mm ball pitch range, but is not limited thereto. According to an embodiment, for example, the pad patterns 110*a*, on which the copper cored solder balls 60 are attached, may have a width w ranging between 100-300 micrometers, but is not limited thereto. According to an embodiment, for example, an aspect ratio of the copper cored solder ball 60 may range between 1.1-2.0. For example, the copper cored solder ball 60 may have an aspect ratio of about 1.44. According to an embodiment, for example, a ball pitch P of the copper cored solder balls 60 may be 0.2-0.3 mm.

According to an embodiment, the sealing resin SM surrounds the copper cored solder balls 60 and covers the passive rear side 50*b* and sidewalls of the logic die 50. According to an embodiment, the sealing resin SM is in direct contact with the bottom surface 300*b* of the top substrate 300, the side surface of the underfill resin 510 and the top surface 100*a* of the bottom substrate 100. The gap between the bottom substrate 100 and the top substrate 300 is sealed with the sealing resin SM. For example, the distance d between the passive rear side 50*b* of the logic die 50 and the bottom surface 300*b* of the top substrate 300 may be equal to or greater than 30 micrometers.

According to an embodiment, each of the copper cored solder balls 60 may comprise a copper core 602 having a diameter of about 10 micrometers, which is coated with a solder layer 604. The copper cored solder balls 60 join the bottom substrate 100 and the top substrate 300. According to an embodiment, for example, the copper core 602 may be formed of copper or copper alloys and shaped into a solid sphere. According to an embodiment, for example, the top substrate 300 having the copper cored solder balls 60 may be mounted onto the top surface 100*a* of the bottom substrate 100 by using a thermal compression bonding (TCB) method.

According to an embodiment, external connection terminals 120 such as solder balls or BGA balls may be joined to the pad patterns 110*b* on the bottom surface 100*b* of the bottom substrate 100, respectively, for further connection with a mother board or a system board. According to an embodiment, a surface mount device 130 such as a capacitor or a resistor may be mounted on the bottom surface 100*b* of the bottom substrate 100.

As previously mentioned, PoP solutions are commonly used in baseband and applications processors in mobile phones. High-end phones have seen the fastest adoption of PoP packaging to provide high I/O and performance requirements. The main advantage of stacked PoP is that devices can be separately fully tested before assembly.

With development of the semiconductor industry, many studies are being conducted to improve reliability and durability of the semiconductor packages. An improvement of the PoP structure to increase the efficiency of thermal dissipation becomes very important.

Figure 2:
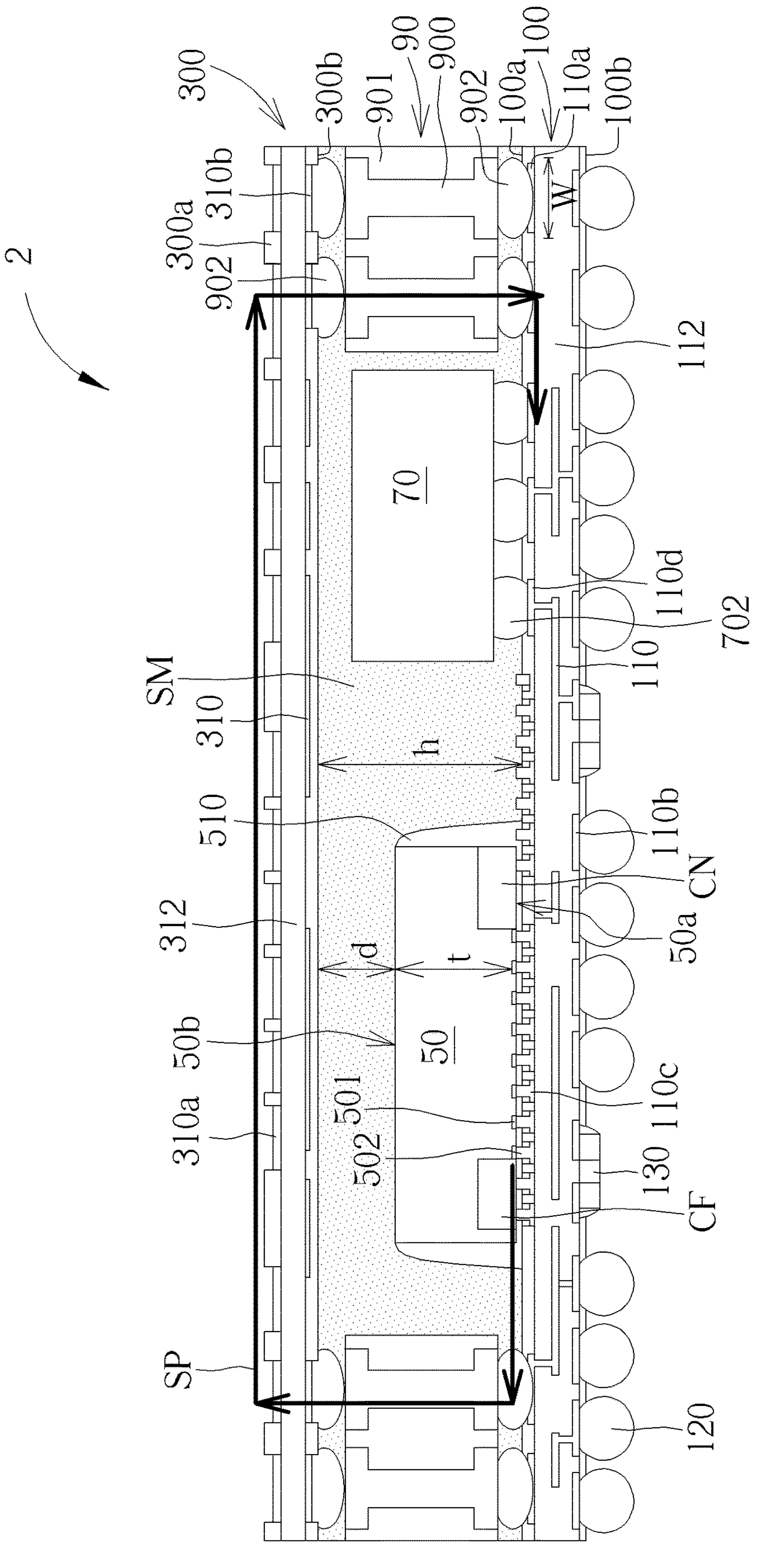
FIG. 2 is a schematic, cross-sectional diagram showing an exemplary semiconductor package having thick logic die in accordance with an embodiment of the present disclosure.

FIG. 2 is a schematic, cross-sectional diagram showing an exemplary semiconductor package having thick logic die in accordance with another embodiment of the present disclosure, wherein like layers, regions or elements are designated by like numeral numbers or labels. As shown in FIG. 2, likewise, the semiconductor package 2, such as a high-bandwidth side-by-side (HBSBS) package, comprises a bottom substrate 100 having a top surface 100*a* and an opposing bottom surface 100*b*. According to an embodiment, the bottom substrate 100 may be a printed wiring board, a re-distribution layer (RDL) substrate, or a package substrate having a plurality of conductive interconnect structures 110 and at least an insulating layer 112. According to an embodiment, for example, the conductive interconnect structures 110 may comprise a plurality of pad patterns 110*a*, 110*c*, and 110*d* distributed on the top surface 100*a* and a plurality of pad patterns 110*b* distributed on the bottom surface 100*b*.

According to an embodiment, a logic die 50 is mounted on the top surface 100*a* of the bottom substrate 100 in a flip-chip fashion. According to an embodiment, for example, the logic die 50 may be a system-on-chip (SoC) die (usually comprises an application processor (AP) and modem), an application processor die or a baseband processor die, but is not limited thereto. According to an embodiment, for example, the logic die 50 has a thickness t ranging between 125-750 micrometers, for example, 125-733 micrometers, which is thicker than a normal logic die (has a thickness of about 80 micrometer) used in high-end mobile devices such as high-end mobile phones. According to some embodiments, for example, the logic die 50 may have a thickness t ranging between 250-750 micrometers. According to some embodiments, for example, the logic die 50 may have a thickness t ranging between 250-733 micrometers.

According to an embodiment, for example, the logic die 50 has an active front side 50*a* and a passive rear side 50*b*. According to an embodiment, for example, a plurality of input/output (I/O) pads 501 is provided on the active front side 50*a*. According to an embodiment, for example, the logic die 50 is electrically connected to the bottom substrate 100 through a plurality of conductive elements 502 such as solder bumps, metal bumps or pillars, which are formed on the plurality of I/O pads 501, respectively. The conductive elements 502 are electrically connected to the pad patterns 110*c* of the conductive interconnect structures 110 of the bottom substrate 100. According to an embodiment, underfill resin 510 may be injected into a space between the logic die 50 and the top surface 100*a* of the bottom substrate 100. According to an embodiment, the conductive elements 502 are surrounded by the underfill resin 510.

According to an embodiment, for example, a memory die 70 is mounted on the top surface 100*a* of the bottom substrate 100 and is disposed in proximity to the logic die 50. The logic die 50 and the memory die 70 are arranged on the top surface 100*a* of the bottom substrate 100 in a side-by-side configuration. According to an embodiment, for example, the memory die 70 may be mounted on the top surface 100*a* of the bottom substrate 100 in a flip-chip fashion, but not limited thereto.

According to an embodiment, for example, the memory die 70 may comprise a dynamic random access memory (DRAM). For example, the memory die 70 is a Double Data Rate (DDR) dynamic random access memory (DRAM) die, such as, a LPDDR DRAM die. For example, the LPDDR DRAM die could be a LPDDR5×DRAM die that can be operated at data rates of up to 8533 Mbps. According to an embodiment, for example, the memory die 70 is electrically connected to the bottom substrate 100 through a plurality of conductive elements 702 such as solder bumps, metal bumps or pillars. The conductive elements 702 are electrically connected to the pad patterns 110*d* of the conductive interconnect structures 110 of the bottom substrate 100.

According to an embodiment, the logic die 50 and the memory die 70 are disposed between the bottom substrate 100 and a top substrate (or a bridge substrate) 300. According to an embodiment, the top substrate 300 may be a printed wiring board, a re-distribution layer (RDL) substrate, or a package substrate having a plurality of conductive interconnect structures 310 and at least an insulating layer 312. According to an embodiment, for example, the conductive interconnect structures 310 may comprise a plurality of pad patterns 310*a* distributed on the top surface 300*a* and a plurality of pad patterns 310*b* distributed on the bottom surface 300*b*. According to an embodiment, connection structure 90 may be disposed between the bottom substrate 100 and the top substrate 300 to electrically connect the top substrate 300 with the bottom substrate 100. The top substrate 300 and the connection structure 90 provide a signal path for signal transmission between the logic die 50 and the far-side DRAM connection circuits of the memory die 70. According to some embodiments, the connection structure 90 may comprise a plurality of conductive structures 900 such as metal pillars, solder balls, metal vias and an insulating layer 901 surrounding the plurality of conductive structures 900. As showing in FIG. 2, the shape of conductive structure 900 may be a "I" shape, and the material of the insulating layer 901 may be a combined material of B (Bismaleimide) and T (Triazine), but is not limited thereto. According to some embodiments, the connection structure 90 may comprise copper cored solder balls as set forth in FIG. 1. According to some embodiments, for example, an aspect ratio of the copper cored solder ball may range between 1.1-2.0, for example, 1.44, as set forth in FIG. 1. According to some embodiments, for example, a ball pitch P of the copper cored solder balls may be 0.2-0.3 mm, as set forth in FIG. 1. In other embodiments, the connection structure 90 may comprise other structures, so the structures of the connection structure 90 are not limited to the examples provided herein.

According to an embodiment, the bottom substrate 100 may be electrically connected with the top substrate 300 via the connection structure 90 and solder balls 902 disposed around the logic die 50 and the memory die 70. The sealing resin SM is filled into a gap having a gap height h between the bottom substrate 100 and the top substrate 300. According to an embodiment, for example, the gap height h may range between 160-1000 micrometers, but is not limited thereto. According to an embodiment, for example, the pad patterns 110*a* may have a width w ranging between 100-300 micrometers, but is not limited thereto.

According to an embodiment, the sealing resin SM surrounds the connection structure 90 and the solder balls 902. According to an embodiment, the sealing resin SM covers the logic die 50 and the memory die 70. According to an embodiment, the sealing resin SM is in direct contact with the bottom surface 300*b* of the top substrate 300, the side surface of the underfill resin 510 and the top surface 100*a* of the bottom substrate 100. The gap between the bottom substrate 100 and the top substrate 300 is sealed with the sealing resin SM. The distance d between the passive rear side 50*b* of the logic die 50 and the bottom surface 300*b* of the top substrate 300 may be equal to or greater than 30 micrometers.

Signals, such as high-speed signals, may be transmitted between the near-side DRAM connection circuit region, such as, DDR connection circuit CN of the logic die 50, which is adjacent to the memory die 70, through the conductive interconnect structures 110 of the bottom substrate 100, such as, the first metal layer of the conductive interconnect structures 110. Signals, such as high-speed signals, may be transmitted between the memory die 70 and the far-side DRAM connection circuit region, such as, DDR connection circuit region CF of the logic die 50 that is disposed farther away from the memory die 70, through the top substrate 300 and the conductive structures 900 of the connection structure 90. For illustrative purposes, the signal transmitting path between the memory die 70 and the far-side DDR connection circuit region CF of the logic die 50 is indicated with arrow SP.

According to an embodiment, external connection terminals 120 such as solder balls or BGA balls are joined to the pad patterns 110*b* on the bottom surface 100*b* of the bottom substrate 100 for further connection with a mother board or a system board. According to an embodiment, a surface mount device 130 such as a capacitor or a resistor may be mounted on the bottom surface 100*b* of the bottom substrate 100.

Figure 3:
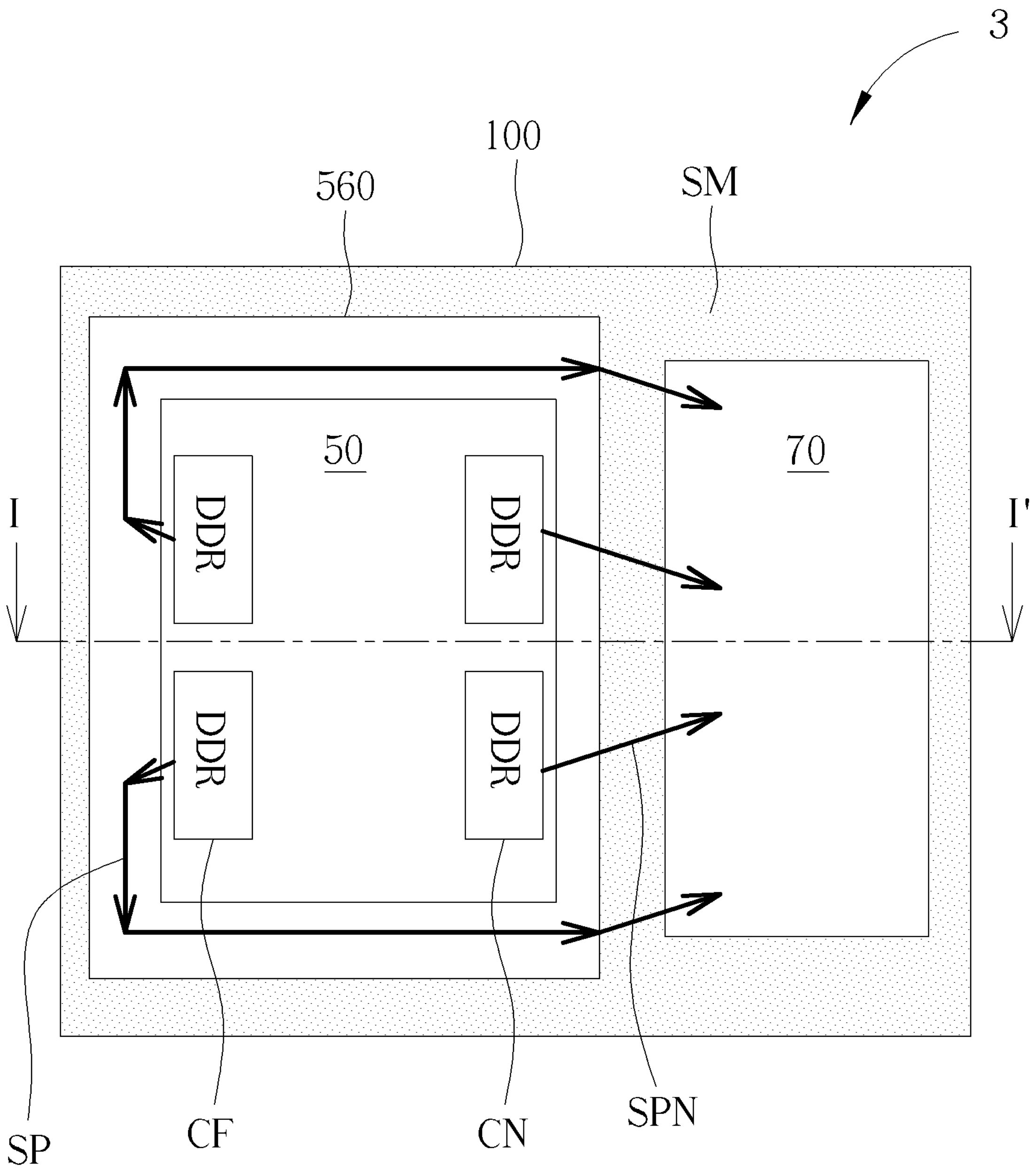
FIG. 3 is a schematic diagram showing an exemplary chip placement of semiconductor package having thick logic die in accordance with another embodiment of the present disclosure.
Figure 4:
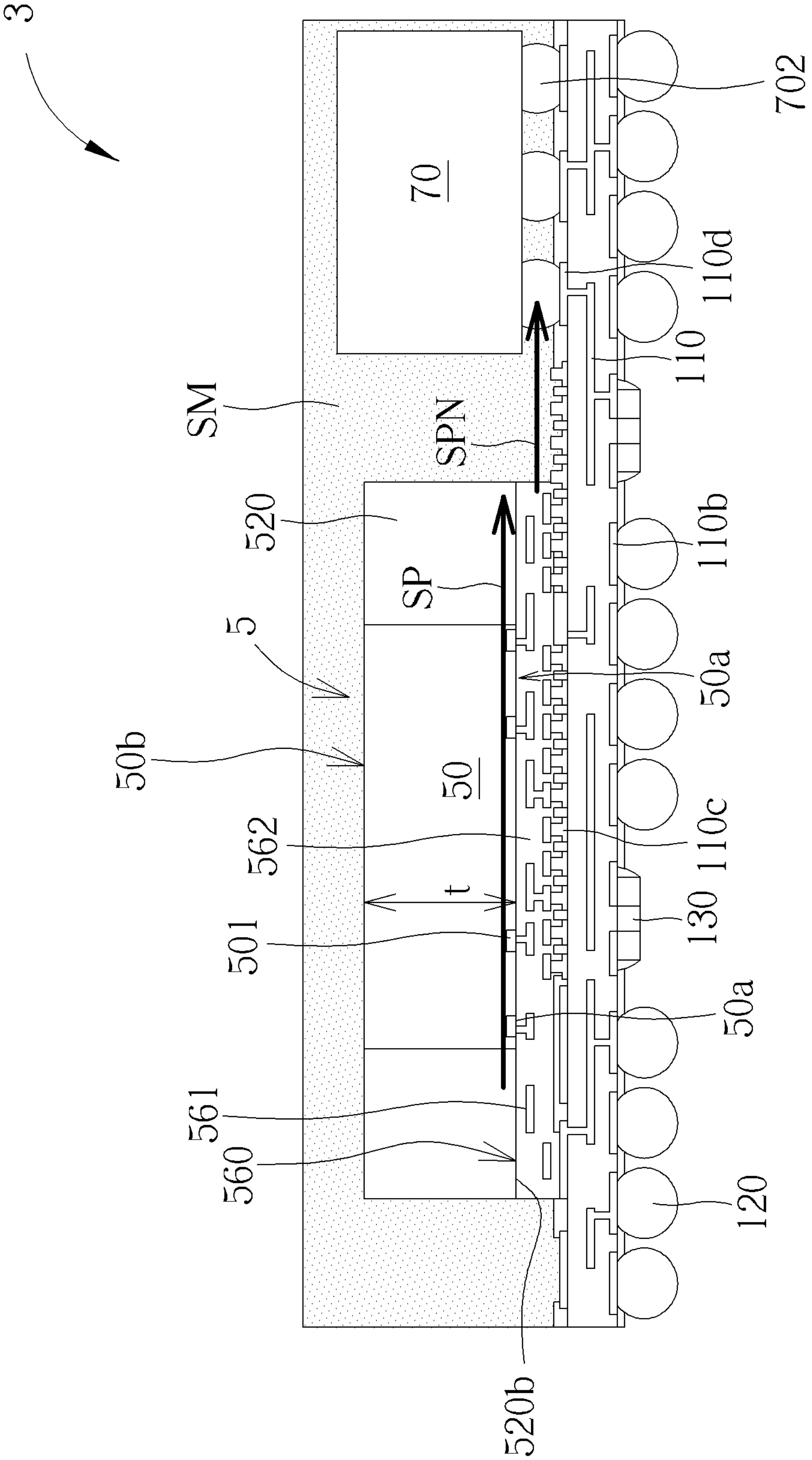
FIG. 4 is a schematic, cross-sectional diagram taken along line I-I' in FIG. 3.

FIG. 3 is a schematic diagram showing an exemplary chip placement of semiconductor package having thick logic die in accordance with another embodiment of the present disclosure. FIG. 4 is a schematic, cross-sectional diagram taken along line I-I' in FIG. 3. As shown in FIG. 3 and FIG. 4, the semiconductor package 3 comprises a bottom substrate 100 having a top surface 100*a* and an opposing bottom surface 100*b*. According to an embodiment, the bottom substrate 100 may be a printed wiring board, a re-distribution layer (RDL) substrate, or a package substrate having a plurality of conductive interconnect structures 110 and at least an insulating layer 112. According to an embodiment, for example, the conductive interconnect structures 110 may comprise a plurality of pad patterns 110*c* and 110*d* distributed on the top surface 100*a* and a plurality of pad patterns 110*b* distributed on the bottom surface 100*b*.

According to an embodiment, a fan-out device 5 including a logic die 50 is mounted on the top surface 100*a* of the bottom substrate 100 in a flip-chip fashion. For example, the fan-out device 5 may be a fan-out chip package. According to an embodiment, for example, the logic die 50 may be a system-on-chip die, an application processor die or a baseband processor die, but is not limited thereto. According to an embodiment, for example, the logic die 50 is overmolded. According to an embodiment, for example, the logic die 50 may have a thickness t ranging between 125-750 micrometers, for example, 125-733 micrometers, which is thicker than a normal logic die (has a thickness of about 80 micrometer) used in high-end mobile devices such as high-end mobile phones. According to some embodiments, for example, the logic die 50 may have a thickness t ranging between 250-750 micrometers. According to some embodiments, for example, the logic die 50 may have a thickness t ranging between 250-733 micrometers.

According to an embodiment, for example, the fan-out device 5 comprises a re-distribution layer (RDL) 560 disposed between the logic die 50 and the bottom substrate 100 to rearrange the I/O pads 501 of the logic die 50. The RDL 560 may be formed on the bottom surface of the molding compound 520 and the active front side 50*a* of the logic die 50. According to an embodiment, for example, the RDL 560 may comprise metal traces 561 and insulating layers 562.

According to an embodiment, likewise, a memory die 70 is mounted on the top surface 100*a* of the bottom substrate 100 and is disposed in proximity to the fan-out device 5. The fan-out device 5 and the memory die 70 are arranged on the top surface 100*a* of the bottom substrate 100 in a side-by-side configuration. According to an embodiment, for example, the memory die 70 may be mounted on the top surface 100*a* of the bottom substrate 100 in a flip-chip fashion, but not limited thereto.

According to an embodiment, for example, the memory die 70 may comprise a dynamic random access memory (DRAM). For example, the memory die 70 is a Double Data Rate (DDR) dynamic random access memory (DRAM) die, such as, a LPDDR DRAM die. For example, the LPDDR DRAM die could be a LPDDR5×DRAM die that can be operated at data rates of up to 8533 Mbps. According to an embodiment, for example, the memory die 70 is electrically connected to the bottom substrate 100 through a plurality of conductive elements 702 such as solder bumps, metal bumps or pillars. The conductive elements 702 are electrically connected to the pad patterns 110$d$ of the conductive interconnect structures 110 of the bottom substrate 100.

Signals, such as high-speed signals, may be transmitted between the memory die 70 and the near-side DRAM connection circuit region, such as, DDR connection circuit region CN of the logic die 50 adjacent to the memory die 70, through the RDL 560 and the conductive interconnect structures 110 of the bottom substrate 100, as indicated by arrow SPN. Signals, such as high-speed signals, may be transmitted between the far-side DRAM connection circuit region, such as, DDR connection circuit region CF of the logic die 50, which is farther away from the memory die 70, through the RDL 560 and the bottom substrate 100, as indicated by arrow SP.

According to an embodiment, the sealing resin SM surrounds the fan-out device 5 and the memory die 70. According to an embodiment, external connection terminals 120 such as solder balls or BGA balls are joined to the pad patterns 110$b$ on the bottom surface 100$b$ of the bottom substrate 100 for further connection with a mother board or a system board. According to an embodiment, a surface mount device 130 such as a capacitor or a resistor may be mounted on the bottom surface 100$b$ of the bottom substrate 100.

Figure 5:
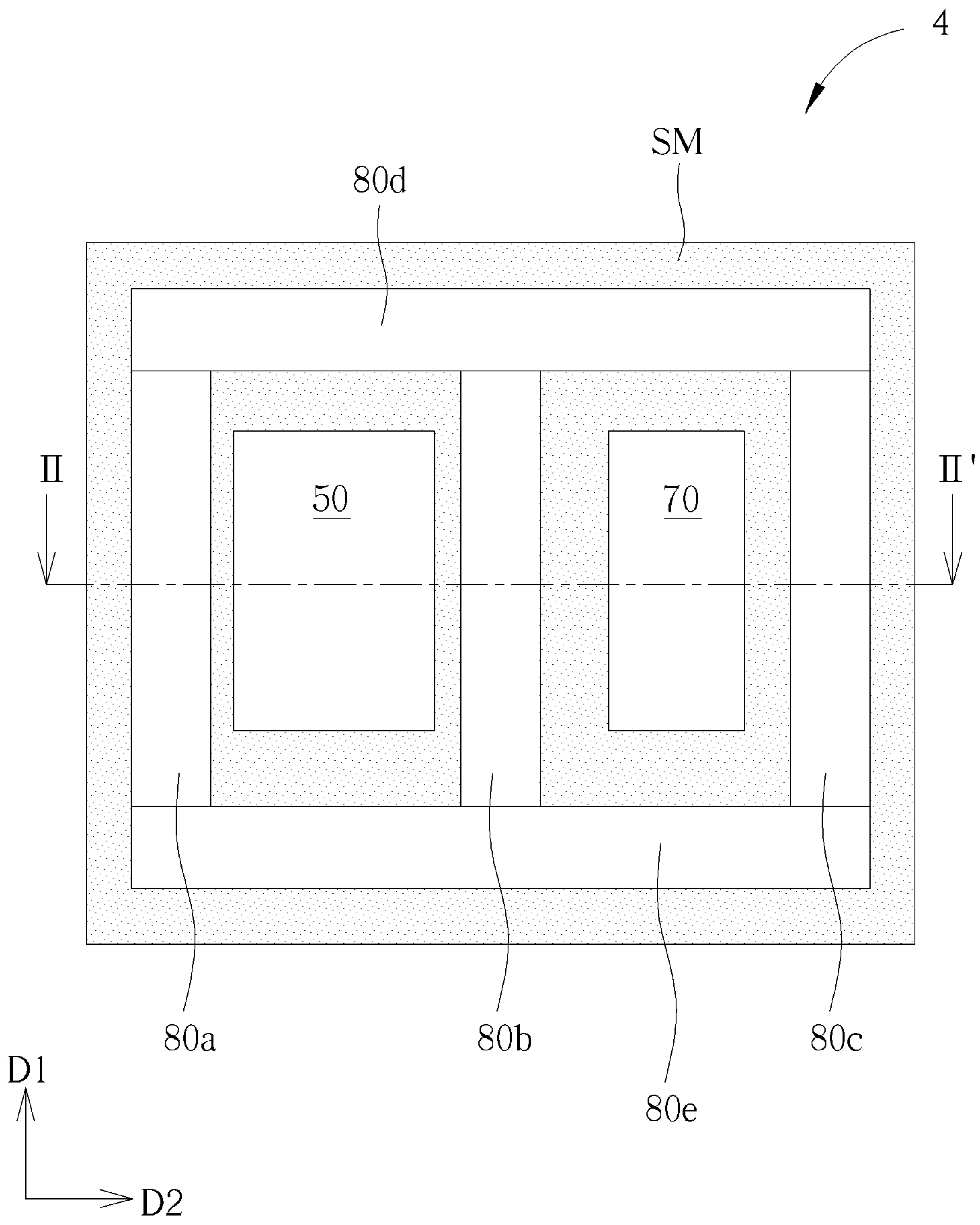
FIG. 5 is a schematic diagram showing an exemplary chip placement of semiconductor package having thick logic die in accordance with still another embodiment of the present disclosure.
Figure 6:
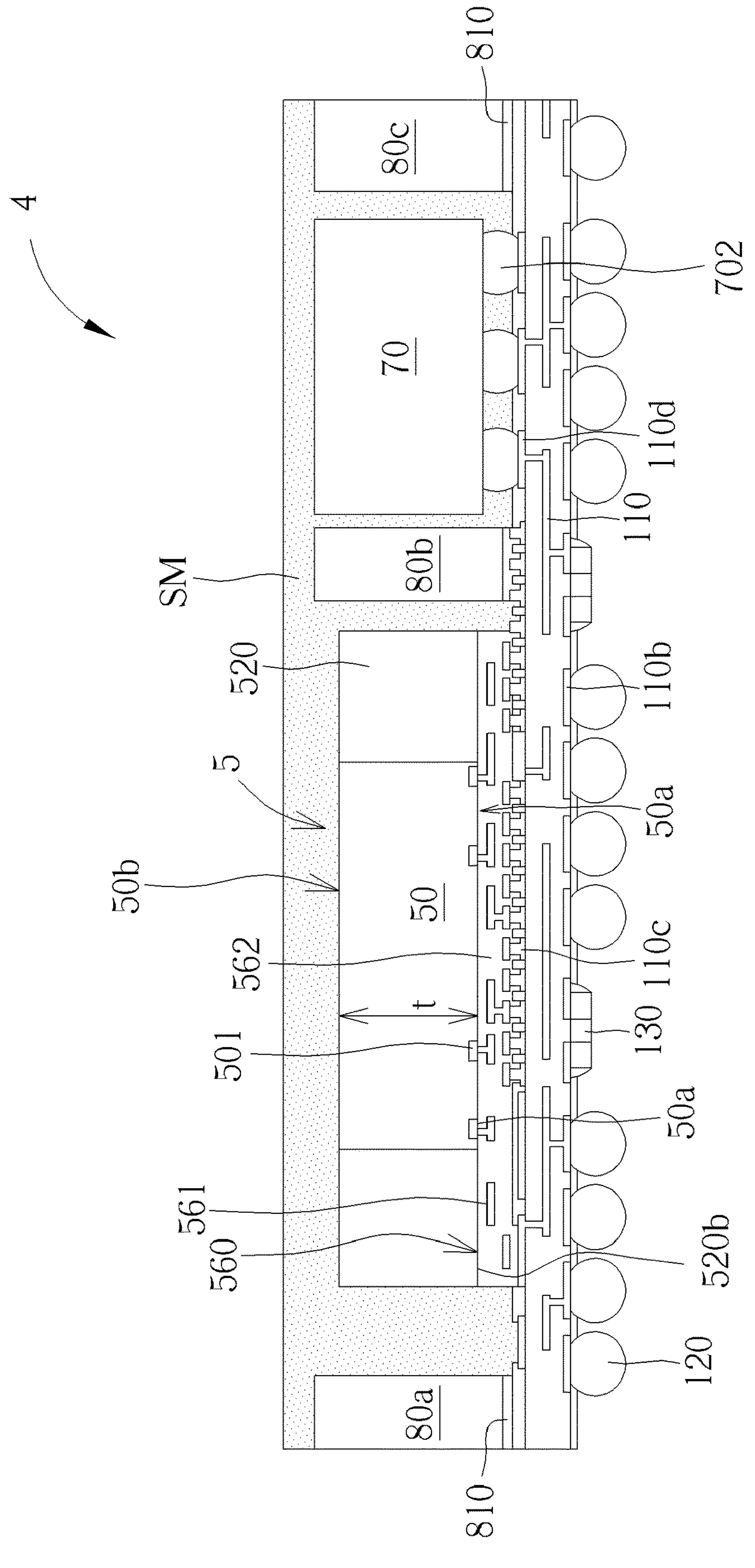
FIG. 6 is a schematic, cross-sectional diagram taken along line II-IF in FIG. 5.

FIG. 5 is a schematic diagram showing an exemplary chip placement of semiconductor package having thick logic die in accordance with still another embodiment of the present disclosure. FIG. 6 is a schematic, cross-sectional diagram taken along line II-II' in FIG. 5. As shown in FIG. 5 and FIG. 6, likewise, the semiconductor package 4, such as a high-bandwidth side-by-side (HBSBS) package, comprises a bottom substrate 100 having a top surface 100$a$ and an opposing bottom surface 100$b$. According to an embodiment, the bottom substrate 100 may be a printed wiring board, a re-distribution layer (RDL) substrate, or a package substrate having a plurality of conductive interconnect structures 110 and at least an insulating layer 112. According to an embodiment, for example, the conductive interconnect structures 110 may comprise a plurality of pad patterns 110$c$ and 110$d$ distributed on the top surface 100$a$ and a plurality of pad patterns 110$b$ distributed on the bottom surface 100$b$.

According to an embodiment, a fan-out device 5 including a logic die 50 is mounted on the top surface 100$a$ of the bottom substrate 100 in a flip-chip fashion. For example, the fan-out device 5 may be a fan-out chip package. According to an embodiment, for example, the logic die 50 may be a system-on-chip die, an application processor die or a baseband processor die, but is not limited thereto. According to an embodiment, for example, the logic die 50 is overmolded. According to an embodiment, for example, the logic die 50 may have a thickness t ranging between 125-750 micrometers, for example, 125-733 micrometers, which is thicker than a normal logic die (has a thickness of about 80 micrometer) used in high-end mobile devices such as high-end mobile phones. According to some embodiments, for example, the logic die 50 may have a thickness t ranging between 250-750 micrometers. According to some embodiments, for example, the logic die 50 may have a thickness t ranging between 250-733 micrometers.

According to an embodiment, for example, the fan-out device 5 comprises a re-distribution layer (RDL) 560 disposed between the logic die 50 and the bottom substrate 100 to rearrange the I/O pads 501 of the logic die 50. The RDL 560 may be formed on the bottom surface of the molding compound 520 and the active front side 50$a$ of the logic die 50. According to an embodiment, for example, the RDL 560 may comprise metal traces 561 and insulating layers 562.

According to an embodiment, likewise, a memory die 70 is mounted on the top surface 100$a$ of the bottom substrate 100 and is disposed in proximity to the fan-out device 5. The fan-out device 5 and the memory die 70 are arranged on the top surface 100$a$ of the bottom substrate 100 in a side-by-side configuration. According to an embodiment, for example, the memory die 70 may be mounted on the top surface 100$a$ of the bottom substrate 100 in a flip-chip fashion, but not limited thereto.

According to an embodiment, for example, the memory die 70 may comprise a dynamic random access memory (DRAM). For example, the memory die 70 is a Double Data Rate (DDR) dynamic random access memory (DRAM) die, such as, a LPDDR DRAM die. For example, the LPDDR DRAM die could be a LPDDR5×DRAM die that can be operated at data rates of up to 8533 Mbps. According to an embodiment, for example, the memory die 70 is electrically connected to the bottom substrate 100 through a plurality of conductive elements 702 such as solder bumps, metal bumps or pillars. The conductive elements 702 are electrically connected to the pad patterns 110$d$ of the conductive interconnect structures 110 of the bottom substrate 100.

According to an embodiment, to cope with the package warpage problem, a stiffener frame may be mounted on the top surface 100$a$ of the bottom substrate 100 with an adhesive layer 810. According to an embodiment, the stiffener frame may comprise high modulus materials. According to an embodiment, for example, the stiffener frame may comprise stainless steel or metal such as, copper, iron, but is not limited thereto. According to an embodiment, the stiffener frame may comprise at least one first stiffener bars, for example, three parallel stiffener bars 80$a$, and 80$c$ disposed in proximity to the fan-out device 5 and the memory die 70. In other embodiments, only one or two of the three parallel stiffener bars 80$a$, 80$b$, and 80$c$ are disposed in proximity to the fan-out device 5 and the memory die 70.

For example, the stiffener bar 80$a$ extends along a first direction D1 and is disposed on a left hand side of the fan-out device 5, the stiffener bar 80$b$ extends along the first direction D1 and is disposed between the fan-out device 5 and the memory die 70, and the stiffener bar 80$c$ extends along the first direction D1 and is disposed on a right hand side of the memory die 70. The fan-out device 5, the memory die 70, and the three parallel stiffener bars 80$a$, 80$b$, and 80$c$ are all encapsulated by the sealing resin SM.

Optionally, the stiffener frame may further comprise at least one second stiffener bars, for example, two parallel stiffener bars 80$d$ and 80$e$. For example, as shown in FIG. 5, the stiffener bar 80$d$ and 80$e$ extends along a second direction D2. For example, the first direction D2 is orthogonal to the second direction D1. According to an example, the stiffener bars 80$a$, 80$b$, 80$c$, 80$d$ and 80$e$ enclose the fan-out device 5 and the memory die 70.

The disclosed high-bandwidth side-by-side (HBSBS) package can solve thermal throttle in PoP structure to boost chip performance and further reduce package height compared with conventional PoP.

Those skilled in the art will readily observe that numerous modifications and alterations of the device and method may be made while retaining the teachings of the present disclosure. Accordingly, the above disclosure should be construed as limited only by the metes and bounds of the appended claims.

What is claimed is:

1. A semiconductor package, comprising:

a bottom substrate and a top substrate space apart from the bottom substrate such that the bottom substrate and the top substrate define a gap therebetween, wherein the bottom substrate comprises conductive interconnect structures;

a logic die and a memory die mounted on a top surface of the bottom substrate in a side-by-side fashion, wherein the logic die has a thickness not less than 125 micrometers, wherein the memory die comprises a dynamic random access memory (DRAM) die;

a connection structure disposed between the bottom substrate and the top substrate around the logic die and the memory die to electrically connect the bottom substrate with the top substrate; and a sealing resin filling in the gap and sealing the logic die, the memory die, and the connection structure in the gap, wherein the logic die comprises a near-side DRAM connection circuit region that is adjacent to the DRAM die and a far-side DRAM connection circuit region that is disposed farther away from the DRAM die, wherein signals are transmitted between the DRAM die and the near-side DRAM connection circuit region through the conductive interconnect structures of the bottom substrate, and signals are transmitted between the DRAM die and the far-side DRAM connection circuit region through the top substrate and the connection structure.

2. The semiconductor package according to claim 1, wherein the logic die has a thickness of 125-750 micrometers.

3. The semiconductor package according to claim 1, wherein the logic die is mounted on the top surface of the bottom substrate in a flip-chip fashion.

4. The semiconductor package according to claim 3, wherein the logic die comprises an active front side and a passive rear side, and wherein, a plurality of input/output (I/O) pads is provided on the active front side and the logic die is electrically connected to the bottom substrate through a plurality of conductive elements formed on the plurality of I/O pads, respectively.

5. The semiconductor package according to claim 1, wherein the DRAM die comprise a Double Data Rate (DDR) DRAM die.

6. The semiconductor package according to claim 5, wherein the DDR DRAM die comprise a Low Power DDR DRAM die.

7. The semiconductor package according to claim 1, wherein the connection structure comprises a plurality of conductive structures and an insulating layer surrounding the plurality of conductive structures.

8. The semiconductor package according to claim 1, wherein the logic die comprises a system-on-chip die, an application processor die, or a baseband processor die.

* * * * *